United States Patent
Shin et al.

(10) Patent No.: US 11,029,856 B2
(45) Date of Patent: Jun. 8, 2021

(54) FLASH MEMORY DEVICE WITH DATA FRAGMENT FUNCTION

(71) Applicant: QUALCOMM Incorporated, San Diego, CA (US)

(72) Inventors: Hyunsuk Shin, San Diego, CA (US); Hung Vuong, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/287,393

(22) Filed: Feb. 27, 2019

(65) Prior Publication Data

US 2019/0272110 A1    Sep. 5, 2019

Related U.S. Application Data

(60) Provisional application No. 62/637,871, filed on Mar. 2, 2018.

(51) Int. Cl.
| | |
|---|---|
| *G06F 3/06* | (2006.01) |
| *G06F 11/30* | (2006.01) |
| *G06F 12/02* | (2006.01) |
| *G11C 16/06* | (2006.01) |

(52) U.S. Cl.
CPC .......... *G06F 3/0619* (2013.01); *G06F 3/061* (2013.01); *G06F 3/064* (2013.01); *G06F 3/0653* (2013.01); *G06F 3/0679* (2013.01); *G06F 3/0688* (2013.01); *G06F 11/3034* (2013.01); *G06F 12/0246* (2013.01); *G06F 2201/81* (2013.01); *G06F 2201/86* (2013.01); *G06F 2212/7205* (2013.01); *G11C 16/06* (2013.01)

(58) Field of Classification Search
CPC ........ G06F 3/061; G06F 3/0619; G06F 3/064; G06F 3/0653; G06F 3/0679; G06F 3/0688; G06F 11/3034; G06F 12/0246; G06F 2201/81; G06F 2201/86; G06F 2212/7205; G11C 16/06
See application file for complete search history.

(56) References Cited

U.S. PATENT DOCUMENTS

| | | | |
|---|---|---|---|
| 5,778,392 A | 7/1998 | Stockman et al. | |
| 9,229,854 B1 * | 1/2016 | Kuzmin | .................. G06F 8/654 |
| 2009/0094433 A1 * | 4/2009 | Thomas | ................ G06F 3/0679 |
| | | | 711/172 |

(Continued)

OTHER PUBLICATIONS

PassMark. "PassMark Fragger—File Fragmentation Utility". Nov. 24, 2009 (Year: 2009).*

(Continued)

*Primary Examiner* — Larry T Mackall
(74) *Attorney, Agent, or Firm* — Qualcomm Incorporated

(57) ABSTRACT

Methods and apparatuses to fragment data in a flash memory device are presented. The apparatus includes a host configured to request a flash memory device, via a memory bus, to fragment data stored in the flash memory device in response to a determination of a data fragmentation status of the flash memory device exceeding a threshold. The method includes determining a data fragmentation status of the flash memory device exceeding a threshold and requesting, by a host, the flash memory device to fragment data stored in the flash memory device in response to the determining the data fragmentation status exceeding the threshold.

26 Claims, 8 Drawing Sheets

(56) References Cited

U.S. PATENT DOCUMENTS

2010/0161882 A1    6/2010  Stern et al.
2012/0151124 A1*   6/2012  Baek .................. G06F 12/0246
                                                              711/103
2018/0196619 A1*   7/2018  Ogawa ................. G06F 3/0647

OTHER PUBLICATIONS

International Search Report and Written Opinion—PCT/US2019/019959—ISA/EPO—dated May 31, 2019.

* cited by examiner

203

Writing to LBA 0 and LBA 1 requires 810 μs

| LBA 0 (Die 1) | 8 KB XFER (10 μs) | 8 KB data write (800 μs) |
| LAB 1 (Die 2) | 8 KB XFER (10 μs) | 8 KB data write (800 μs) |

205

Writing to LBA 0 and LBA 1 requires 1620 μs

| 8 KB XFER (10 μs) | 8 KB data write (800 μs) | 8 KB XFER (10 μs) | ••• |
| LBA 0 (Die 1) | | LAB 1 (Die 1) | |

Reading LBA 0 and LBA 1 requires 80 μs

| LBA 0 (Die 1) | 8 KB data read (70 μs) | 8 KB XFER (10 μs) |
| LAB 1 (Die 2) | 8 KB data read (70 μs) | 8 KB XFER (10 μs) |

305

Writing to LBA 0 and LBA 1 requires 160 μs

| 8 KB XFER (10 μs) | 8 KB data read (70 μs) | 8 KB XFER (10 μs) | ••• |
| LBA 0 (Die 1) | | LAB 1 (Die 1) | |

FIG. 3

FLASH MEMORY DEVICE WITH DATA FRAGMENT FUNCTION

CROSS-REFERENCE TO RELATED APPLICATION

This application claims the priority benefit of U.S. Provisional Application Ser. No. 62/637,871, entitled "FLASH MEMORY DEVICE WITH DATA FRAGMENT FUNCTION" and filed on Mar. 2, 2018, which is expressly incorporated by reference herein in its entirety.

BACKGROUND

Field

The present disclosure relates generally to apparatuses incorporating memory devices, and more particularly, to methods and apparatuses incorporating flash memory devices with data fragment function.

Background

Flash memory is a key component for modern electronic systems. Flash memory is a type of non-volatile memory that retains stored data even when no power is applied to the memory. The electronic system may store data and programs on the flash memory and fetch the data and programs when needed. Thus, the performance of the flash memory directly impacts the performance of the electronic system.

Over a period of operations, physical locations of data stored in a flash memory may move for various reasons. For example, the data may be moved in the flash memory device to even wear and tear among blocks in the flash memory device. In another example, data errors may occur in flash memory device due to, or example, aging, temperature fluctuations, charge loss, and so on. Refresh operations are performed on the flash memory to correct these data errors. In flash memory, a refresh operation involves reading all the data from one particular memory block, correcting any errors in the read data, and then rewriting the corrected data back into the same memory block or a different memory block. Performance issues may arise from moving the physical locations and may need to be remedied.

SUMMARY

This summary identifies features of some example aspects, and is not an exclusive or exhaustive description of the disclosed subject matter. Whether features or aspects are included in, or omitted from this Summary is not intended as indicative of relative importance of such features. Additional features and aspects are described, and will become apparent to persons skilled in the art upon reading the following detailed description and viewing the drawings that form a part thereof.

Aspects of an apparatus are presented. The apparatus includes a host configured to request a flash memory device, via a memory bus, to fragment data stored in the flash memory device in response to a determination of a data fragmentation status of the flash memory device exceeding a threshold.

Aspects of another apparatus are presented. The apparatus includes a flash memory device configured to receive from a host, via a memory bus, a request to fragment data stored in the flash memory device and to fragment the data stored in the flash memory device in response to the request to fragment the data stored in the flash memory device.

Aspects of a method to fragment data in a flash memory device are presented. The method includes determining a data fragmentation status of the flash memory device exceeding a threshold and requesting, by a host, the flash memory device to fragment data stored in the flash memory device in response to the determining the data fragmentation status exceeding the threshold.

BRIEF DESCRIPTION OF THE DRAWINGS

Various aspects of apparatus and methods will now be presented in the detailed description by way of example, and not by way of limitation, with reference to the accompanying drawings, wherein:

FIG. 2 is a diagram of write access times of the L2P mappings of FIG. 1.

FIG. 3 is a diagram of read access times of the L2P mappings of FIG. 1.

DETAILED DESCRIPTION

The detailed description set forth below in connection with the appended drawings is intended as a description of various configurations and is not intended to represent the only configurations in which the concepts described herein may be practiced. The detailed description includes specific details for providing a thorough understanding of various concepts. However, it will be apparent to those skilled in the art that these concepts may be practiced without these specific details. In some instances, well known structures and components are shown in block diagram form to avoid obscuring such concepts.

As used herein, the term "coupled to" in the various tenses of the verb "couple" may mean that element A is directly connected to element B or that other elements may be connected between elements A and B (i.e., that element A is indirectly connected with element B). In the case of electrical components, the term "coupled to" may also be used herein to mean that a wire, trace, or other electrically conductive material is used to electrically connect elements A and B (and any components electrically connected therebetween).

Methods and apparatuses incorporating flash memory devices with data fragment function are presented in the disclosure. The data fragment function improves performance of the flash memory device by addressing performance issues arose from moving physical locations of data stored in the flash memory device. The methods and apparatuses are presented with an Universal Flash Storage (UFS) memory system, but the extent of the disclosure is not limited to UFS systems.

Figure 1:
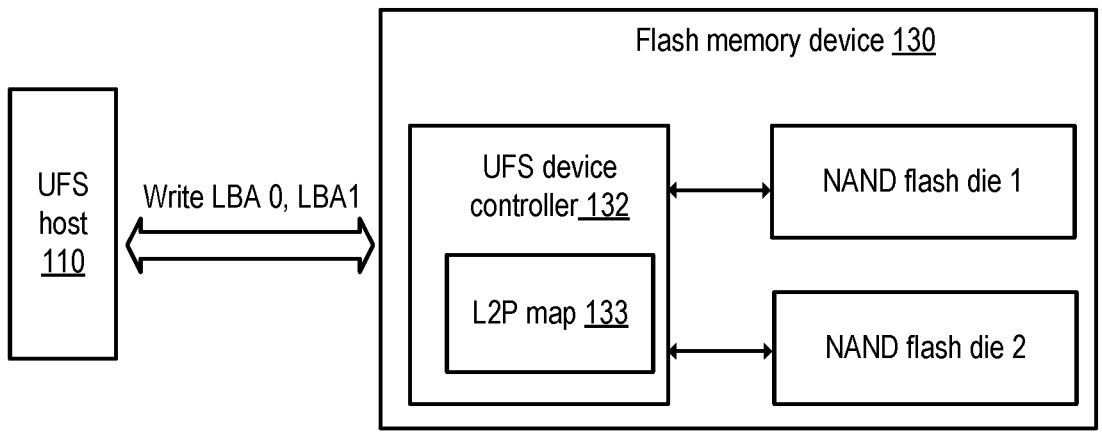
FIG. 1 is a diagram of an apparatus incorporating a flash memory device and examples of data stored in the flash memory device.

FIG. 1 is a diagram of an apparatus 100 incorporating a flash memory device and examples of data stored in the flash memory device. The apparatus 100 includes an UFS host 110 communicating with a flash memory device 130. The UFS host 110 may be configured to send instructions (e.g., read, write commands) to and the flash memory device 130 and to receive various status information and event interrupts from the flash memory device 130. The UFS host 110 may be configured to send data (e.g., write data) to and the flash memory device 130 and to receive data (e.g., read data) from the flash memory device 130. The flash memory device 130 includes an UFS device controller 132 and, for data storage, NAND flash die 1 and NAND flash die 2. The NAND flash die 1 and the NAND flash die 2 include flash memory cells to store data for read and write operations. The UFS device controller 132 further includes an L2P map 133. The L2P map 133 is configured to store logic block addresses (LBAs) and corresponding physical block addresses (PBAs) (i.e., logic-2-physical or L2P mapping).

In some examples, the UFS host 110 may send read or write commands incorporating LBAs to the UFS device controller 132. In response, the UFS device controller 132 may access the L2P map 133 to determine the PBAs corresponding to the received LBAs. The UFS device controller 132 may then use the PBAs to read/write the NAND flash die 1 or the NAND flash die 2.

FIG. 1 illustrates examples of L2P mapping: a first L2P mapping 103 and a second L2P mapping 105. The first L2P mapping 103 stores an example of fragmented LBAs and corresponding PBAs. In the first L2P mapping 103, LBA 0 is mapped to the NAND flash die 1, and LBA 1 is mapped to NAND flash die 2. Thus, for the UFS host 110 to access the continuous LBA 0 and LBA 1 for the first L2P mapping 103, the flash memory device 130 (via the UFS device controller 132) may access the NAND flash die 1 and the NAND flash die 2 in parallel. For example, the UFS device controller 132 may access the NAND flash die 1 to read/write LBA 0 and, in parallel (e.g., concurrently in time), access the NAND flash die 2 to read/write LBA 1.

In some instances, L2P mapping may be changed due to various UFS device maintenance functions (e.g., garbage collection, wear leveling, etc.) and becomes less fragmented (e.g., physical data locations becoming more concentrated in terms of flash memory dies). For example, data stored in the NAND flash dies 1 and 2 may be moved due to the device maintenance functions, and sometimes, data may be moved to a different die. The L2P mapping would thus change accordingly.

The second L2P mapping 105 demonstrates an effect of such mapping changes. In the second L2P mapping 105, the LBA 1 is mapped to the NAND flash die 1 (instead of being mapped to the NAND flash die 2, as an example of the L2P mapping changes due to the device maintenance functions). Thus, for the UFS host 110 to access the continuous LBA 0 and LBA 1 in the case of the second L2P mapping 105, the flash memory device 130 (via the functions of the UFS device controller 132) may have to access the NAND flash die 1 in series. For example, the UFS device controller 132 may need to access the NAND flash die 1 to read/write LBA 0 and then access the NAND flash die 1 again to read/write LBA 1.

In some examples, the first L2P mapping 103 demonstrates higher data fragmentation than the second L2P mapping 105. Data in the first L2P mapping 103, such as continuous LBAs 0 and 1, are stored in more diverse locations (different dies) than data in the second L2P mapping 105 (LBAs 0 and 1 are stored on a same die).

FIG. 2 is a diagram of write access times of the L2P mappings of FIG. 1. A write access diagram 203 and a write access diagram 205 illustrate an effect of data fragmentation on write access times for a flash memory device. In FIG. 2, as an example, a write access time includes 10 μs of transfer time to transfer 8 KB write data from the UFS host 110 to the flash memory device 130 (both of FIG. 1). The write access time further includes 800 μs of data write time for the flash memory device 130 to write the 8 KB write data into memory cells in the NAND flash die 1 or the NAND flash die 2. The write access time to write a single LBA is thus 810 μs in the example.

The write access diagram 203 illustrate a write access time for writing LBA 0 and LBA 1 of the first L2P mapping 103 (see FIG. 1). Writing LBA 0 takes 810 μs, which includes 10 μs transfer time to transfer 8 KB write data (e.g., from the UFS host 110 to the flash memory device 130 of FIG. 1), and 800 μs data write time to write the 8 KB write data into memory cells of the flash memory device (e.g., to write into the NAND flash die 1 or the NAND flash die 2 of the flash memory device 130; see FIG. 1). Writing LBA 1 similarly takes 810 μs, and may take place in parallel (e.g., concurrently in time) with writing LBA 0, since LBA 1 is on a different die. Referring to the L2P mapping 103 in FIG. 1, LBA 0 is to be written into the NAND flash die 1, and LBA 1 is to be written into the NAND flash die 2. Accordingly, writing both LBA 0 and LBA 1 takes 810 μs due to data fragmentation allowing both writes to take place in parallel.

The write access diagram 205 illustrate a write access time for writing LBA 0 and LBA 1 of the second L2P mapping 105 (see FIG. 1). Writing LBA 0 takes 810 μs, which includes 10 μs transfer time to transfer 8 KB write data (e.g., from the UFS host 110 to the flash memory device 130 of FIG. 1), and 800 μs data write time to write the 8 KB write data into memory cells of the flash memory device (e.g., to write into the NAND flash die 1 or the NAND flash die 2 of the flash memory device 130; see FIG. 1). Writing LBA 1 similarly takes 810 μs. Referring to the second L2P mapping 105 in FIG. 1, LBA 0 is to be written into the NAND flash die 1, and LBA 1 is likewise to be written into the NAND flash die 1. Accordingly, due to a lack of data fragmentation of the second L2P mapping 105 (LBA 0 and LBA 1 are both mapped to a same flash memory die), LBA 0 and LBA 1 are written in series. Thus, a total write access time to write LBA 0 and LBA 1 is 1620 μs (i.e., 810 μs to write LBA 0, and then 810 μs to write LBA 1).

FIG. 3 is a diagram of read access times of the L2P mappings of FIG. 1. A read access diagram 303 and a read access diagram 305 illustrate a data fragmentation effect on read access times for a flash memory device. In FIG. 3, as an example, a read access time includes 70 μs of data read time for the flash memory device 130 (see FIG. 1) to read 8 KB read data from memory cells in the NAND flash die 1 or the NAND flash die 2 (see FIG. 1). The read access time further includes 10 μs of transfer time to transfer the 8 KB read data from the flash memory device 130 to the UFS host 110 to (see FIG. 1). The read access time for reading a single LBA is thus 80 μs in the example.

The read access diagram 303 illustrate a read access time for reading LBA 0 and LBA 1 of the first L2P mapping 103 (see FIG. 1). Reading LBA 0 takes 80 μs, which includes 70 μs data read time to read 8 KB read data from memory cells of the flash memory device (e.g., to read from the NAND flash die 1 or the NAND flash die 2 of the flash memory device 130; see FIG. 1) and 10 µs transfer time to transfer the 8 KB read data (e.g., from the flash memory device 130 to the UFS host 110 of FIG. 1). Reading LBA 1 similarly takes 80 µs, and may take place in parallel (e.g., concurrently in time) with reading LBA 0, since LBA 1 is on a different die. Referring the first L2P mapping 103 in FIG. 1, LBA 0 is to be read from the NAND flash die 1, and LBA 1 is to be read from the NAND flash die 2. Accordingly, reading LBA 0 and LBA 1 takes 80 µs due to data fragmentation allowing both reads to take place in parallel.

The read access diagram 305 illustrate a read access time for reading LBA 0 and LBA 1 of the second L2P mapping 105 (FIG. 1). Reading LBA 0 takes 80 µs, which includes 70 µs data read time to read 8 KB read data from memory cells of the flash memory device (e.g., to read from the NAND flash die 1 or the NAND flash die 2 of the flash memory device 130; see FIG. 1) and 10 µs transfer time to transfer the 8 KB read data (e.g., from the flash memory device 130 to the UFS host 110 of FIG. 1). Reading LBA 1 similarly takes 80 µs. Referring the second L2P mapping 105 in FIG. 1, LBA 0 is to be read from the NAND flash die 1, and LBA 1 is likewise to be read from the NAND flash die 1. Accordingly, due to a lack of data fragmentation of the second L2P mapping 105 (LBA 0 and LBA 1 are both mapped to a same flash memory die), LBA 0 and LBA 1 are read in series. Thus, a total read access time to read LBA 0 and LBA 1 is 160 µs (i.e., 80 µs to read LBA 0, and then 80 µs to read LBA 1).

As presented with FIGS. 1-3, performance of a flash memory device may degrade over time due to changes to data fragmentation (as reflected by L2P mapping changes). Such changes may arise from device maintenance functions associated with flash memories (e.g., garbage collection, wear leveling, etc.). For example, as presented with FIG. 2, write access time for writing two continuous LBAs may increase from 810 µs to 1620 µs, due to a decrease in data fragmentation. FIG. 3 illustrates that read access time for reading two continuous LBAs may increase from 80 µs to 160 µs, due to a decrease in data fragmentation. The disclosure presents methods and apparatuses that improve the performance of the flash memory by performing data fragmentation or interleaving of physical locations of data stored in the flash memory. In such fashion, data fragmentation of data stored in the flash memory may be increased.

Several aspects of methods and apparatuses (e.g., systems) incorporating a flash memory device will now be presented. These methods and apparatuses will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the application and design constraints imposed on the overall system. Examples of the apparatuses may include computing systems (e.g., servers, datacenters, desktop computers, mobile computing systems (e.g., laptops, cell phones, vehicles, etc.), Internet of Things devices, and virtual reality or augmented reality systems.

Figure 4:
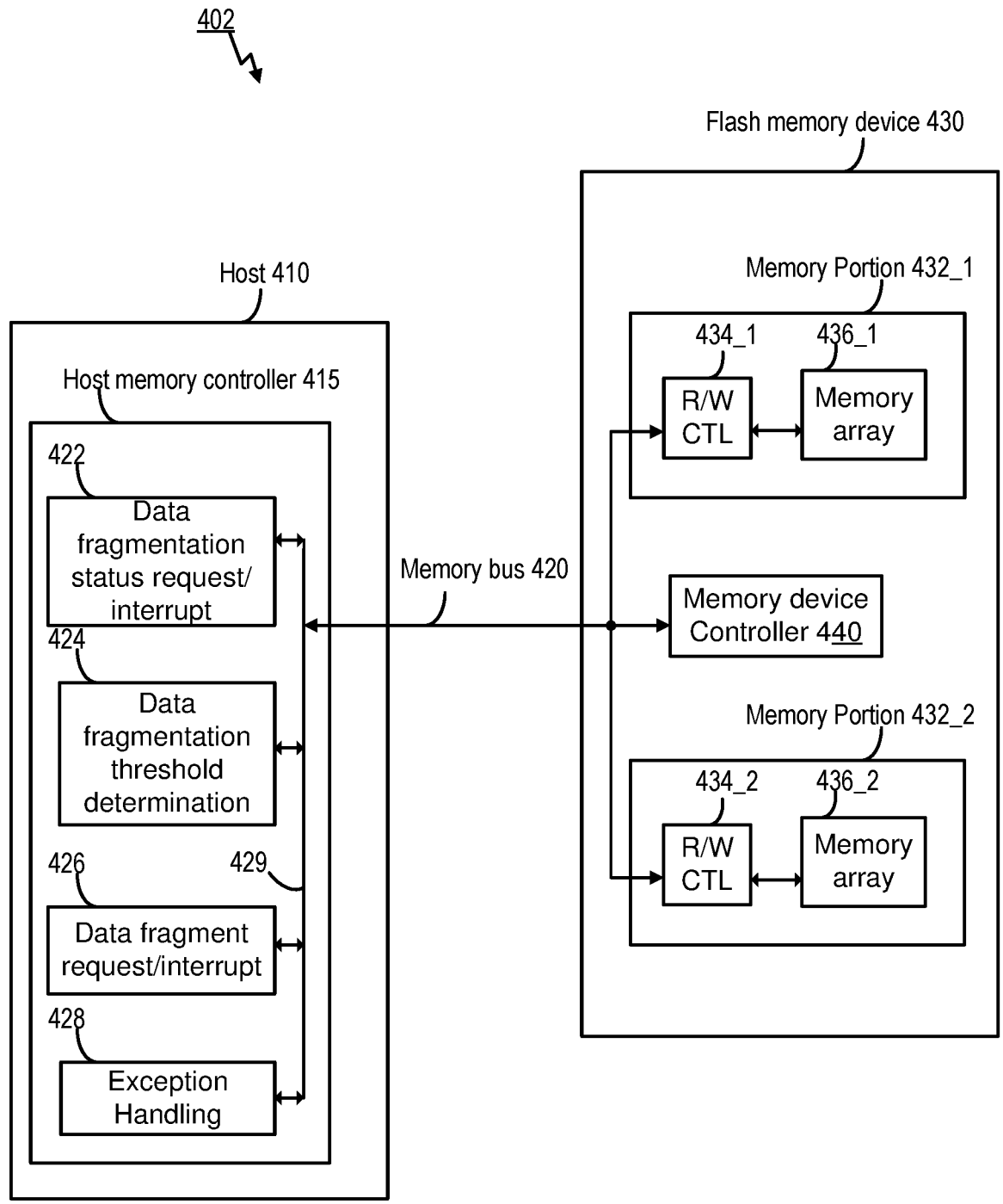
FIG. 4 is a diagram of an apparatus incorporating a host, a memory bus, and a flash memory device, in accordance with certain aspects of the disclosure.

FIG. 4 is a diagram of an apparatus 402 incorporating a host, a memory bus, and a flash memory device, in accordance with certain aspects of the disclosure. The apparatus 402 may include, for example, one of a computing system, a mobile computing system, an Internet of Things device, and a virtual reality or augmented reality system. The apparatus 402 includes a host 410, a flash memory device 430, and a memory bus 420 via which the host 410 communicates with the flash memory device 430. Such communications over the memory bus 420 may include commands and status (e.g., flags and attributes). The host 410 may include, for example, a processor (e.g., hardware, software, or a combination thereof) managing the flash memory device 430. The flash memory device 430 may include a NAND flash memory system, such as a UFS or an embedded MultiMediaCard (eMMC) device. For example, the host 410 and the flash memory device 430 may communicate over the memory bus 420 via a flash storage specification, such UFS or eMMC. In some examples, the host 410 and the flash memory device 430 may be on different dies, and the memory bus 420 may include a die-to-die connection. As examples, the flash memory device 430 may include the flash memory device 130 (see FIG. 1), and the host 410 may include the UFS host 110 (see FIG. 1).

The flash memory device 430 includes multiple memory portions: memory portions 432_1 and 432_2. Two portions are shown as a non-limiting example. Each memory portion may include, for example, a different flash memory die or chip. For example, the memory portion 432_1 may include the NAND flash die 1 of FIG. 1, and the memory portion 432_2 may include the NAND flash die 2 of FIG. 1. A memory portion may be characterized by having a read/write control that controls the access to the memory portion to/from a memory interface common to the multiple memory portions. The memory portion 432_1 (e.g., a flash memory die or chip) includes a memory array 436_1 to store data, and a read/write control 434_1 to control read/write access of the memory array 436_1 to/from the memory bus 420. Likewise, the memory portion 432_2 (e.g., a flash memory die or chip separate from the memory portion 432_1) includes a memory array 436_2 to store data, and a read/write control 434_2 to control read/write access of the memory array 436_1 to/from the memory bus 420.

The flash memory device 430 further includes a memory device controller 440 configured manage memory accesses and various functions of the flash memory device 430. The memory device controller 440 may, for example, include the UFS device controller 132 in FIG. 1. The memory device controller 440 are further presented with FIG. 5.

The host 410 includes a host memory controller 415 configured to control the flash memory device 430. The host memory controller 415 may, for example, include the UFS host 110 (see FIG. 1). For example, the host memory controller 415 may be configured to send read, write, and various other commands and data to the flash memory device 430 and receive from the flash memory device 430 data and status information, via the memory bus 420. The host memory controller 415 includes some or all of the following modules: data fragmentation status request/interrupt 422, data fragmentation threshold determination 424, data fragment request/interrupt 426, and exception handling 428. The data fragmentation status request/interrupt 422, the data fragmentation threshold determination 424, the data fragment request/interrupt 426, and/or the exception handling 428 may be coupled (e.g., information being sent and received among the modules) via a bus system 429 and may communicate with the flash memory device 430.

The data fragmentation status request/interrupt 422 (and therefore, the host 410 incorporating the module) is configured to request, via the memory bus 420, the flash memory device 430 to report a data fragmentation status. For example, the data fragmentation status request/interrupt 422 may issue the request periodically, and/or while the host 410 is not in performance-intensive operations. The request may result in the flash memory device 430 scanning data stored therein (e.g., scanning a L2P mapping). Such scanning may be time consuming. The data fragmentation status request/interrupt 422 (and therefore, the host 410 incorporating the module) may thus be further configured to interrupts, via the memory bus 420, the request for the flash memory device 430 to report the data fragmentation status, and accordingly, interrupts the flash memory device 430 determining the fragment statue. For example, the flash memory device 430 halts the fragment statue determination process in response to the data fragmentation status request/interrupt 422 interrupting the request to report the data fragmentation status.

Data fragmentation, for example, may correspond to a distribution of associated pieces of data (e.g., continuous) among or within the memory portions. Examples of data fragmentation and effects thereof are presented with FIGS. 1-3. The data fragmentation status may be expressed as a percentage.

An example of the request to report data fragmentation status includes a command requesting the flash memory device 430 to scan data stored therein for the data fragmentation status. Examples of such commands (e.g., flags and attributes expressed in UFS format are shown in Table 1 below:

TABLE 1

| FLAGS | | | | | |
|---|---|---|---|---|---|
| IDN | Name | Type | Type #Ind. #Sel. | Default | Description |
| xxh | fFragScanEn | Write only/ volatile | D | 0 | FragScan Enable 0b: Frag Scan operation is disabled. 1b: Frag Scan operation is enabled. fFragScanEn is automatically cleared by the UFS device when the operation completes or an error condition occurs. fFragScanEn can be cleared by the host to interrupt the ongoing FragScan operation. |

| ATTRIBUTES | | | | | | | |
|---|---|---|---|---|---|---|---|
| IDN | Name | Access Property | Size | Type #Ind. #Sel. | MDV | Description | Notes |
| xxh | dFragScanStatus | Read only | 1 byte | D | 00h | FragScan Operation Status 00h: Idle (FragScan operation disabled) 01h: FragScan operation in progress 02h: FragScan operation stopped prematurely 03h: FragScan operation completed successfully 04h: FragScan operation general failure | |

| ATTRIBUTES | | | | | | | |
|---|---|---|---|---|---|---|---|
| IDN | Name | Access Property | Size | Type #Ind. #Sel. | MDV | Description | Notes |
| xxh | dFragPercentage | Read only | 1 byte | D | 00h | Fragmentation percentage indicated the amount of physical fragmentation in %. dFragPercentage will indicate 0.000%-100.000% in decimal. | |

In the TABLE 1, the request to report data fragmentation status may include the data fragmentation status request/interrupt 422 (and therefore, the host 410 incorporating the module) setting the flag fFragScanEn to effect the data fragmentation scanning operation in the flash memory device 430. The attributes shown in TABLE 1 may be entered or reported by the flash memory device 430 in response to the request for data fragmentation status. The data fragmentation status request/interrupt 422 (and therefore, the host 410 incorporating the module) may be further configured to receive the data fragmentation status from the flash memory device 430, via the memory bus 420. For example, the data fragmentation status request/interrupt 422 may read the attribute dFragPercentage to receive the data fragmentation status.

The data fragmentation threshold determination 424 (and therefore, the host 410 incorporating the module) is configured to determine whether the data fragmentation status (e.g., reported by the flash memory device 430 via the attribute dFragPercentage of Table 1) exceeds a threshold. For example, the data fragmentation threshold determination 424 may compare the percentage in the attribute dFragPercentage to a preset percentage (the threshold). In some examples, the data fragmentation threshold determination 424 (and therefore, the host 410 incorporating the module) may be configured to determine whether the data fragmentation status exceeds a threshold via an exception event triggered by the flash memory device 430.

Examples of the exception event triggered by the flash memory device 430 are shown in TABLE 2 below as attributes expressed in UFS format:

430, in response to the determination of the data fragmentation status exceeding the threshold. For example, the data fragment request/interrupt 426 may set the flag fFragScanEn (TABLE 1) shown above to request the data fragmentation. The data fragment request/interrupt 426 (and therefore, the host 410 incorporating the module) may be further configured to interrupt to the flash memory device 430 fragmenting the data stored in the flash memory device 430, under certain conditions (e.g., via resetting the flag fFragScanEn in TABLE 1).

The exception handling 428 (and therefore, the host 410 incorporating the module) is configured to handle various exception events, some of which may be triggered by the flash memory device 430. For example, the exception handling 428 may operate the according to the FRAG_EVENT_EN bit and the FRAG_NEEDED bit provided in TABLE 1. The FRAG_EVENT_EN bit and the FRAG_NEEDED bit may indicate that the flash memory device 430 has determined the data fragmentation status exceeds the threshold without responding to a specific request from the host 410 to determine the data fragmentation status (e.g., without the host 410 setting the flag fFragScanEn of TABLE 1).

Figure 5:
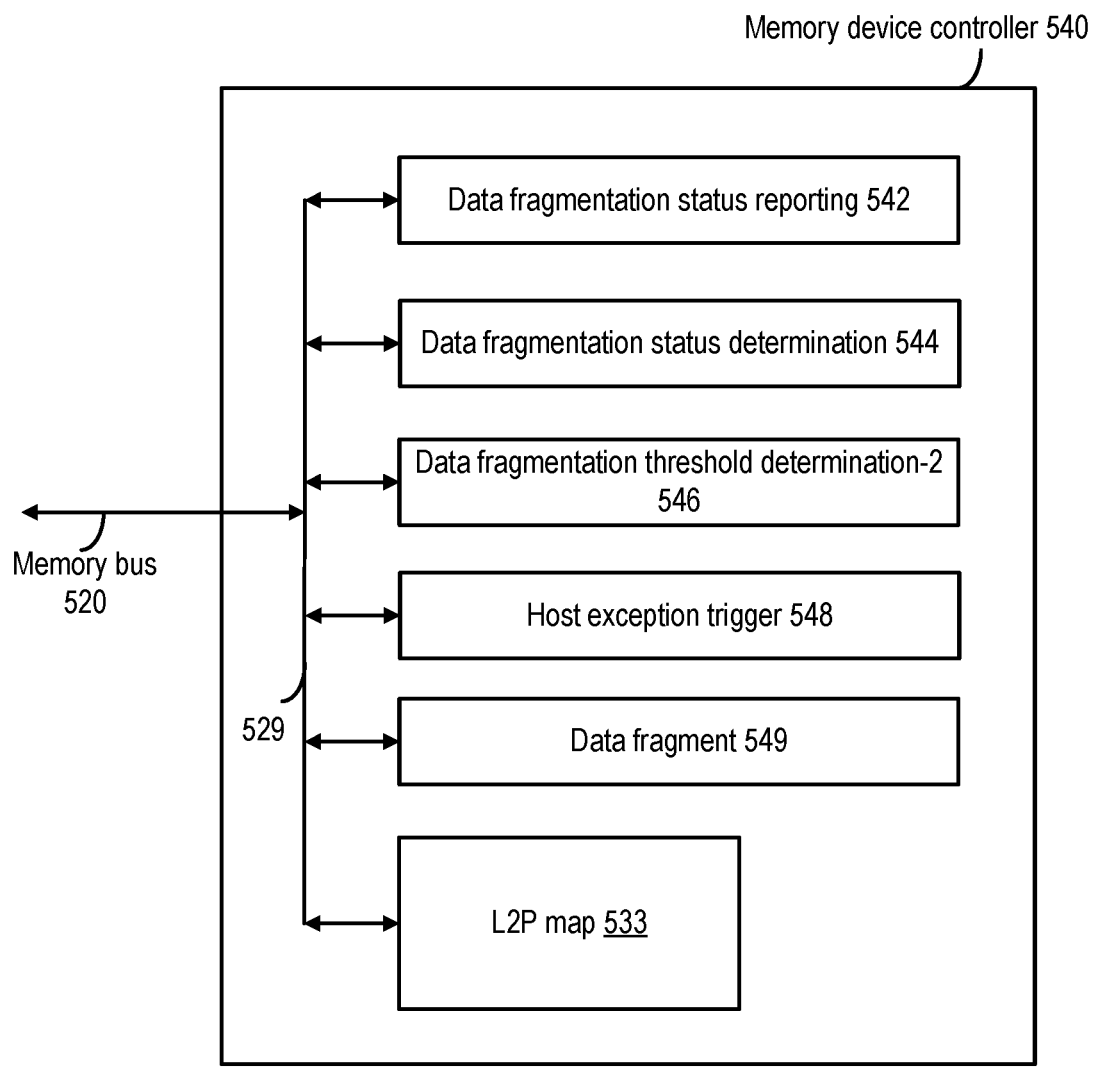
FIG. 5 is a diagram of a memory device controller, in accordance with certain aspects of the disclosure.

FIG. 5 is a diagram of a memory device controller 540, in accordance with certain aspects of the disclosure. The memory device controller 540 may be an instance of the memory device controller 440 in FIG. 4. Accordingly, in some examples, the flash memory device 430 (in FIG. 4) may incorporate the memory device controller 540. The memory device controller 540 communicates with a host (e.g., host 410 in FIG. 4) via a memory bus 520. The memory bus 520 may be an instance of the memory bus 420 in FIG. 4.

TABLE 2

| | | | ATTRIBUTES | | | | |
|---|---|---|---|---|---|---|---|
| IDN | Name | Access Property | Size | Type #Ind. #Sel. | MDV | Description | Notes |
| 0Dh | wExceptionEventControl | Read/ Volatile | 2 bytes | D | 0000h | Bit 0: DYNCAP_EVENT_EN Bit 1: SYSPOOL_EVENT_EN Bit 2: URGENT_BKOPS_EN Bit 3: FRAG_EVENT_EN Bit 4-15: Reserved | |
| 0Eh | wExceptionEventStatus | Read only | 2 bytes | D | 000h | Bit 0: DYNCAP_NEEDED Bit 1: SYSPOOL_EXHAUSED Bit 2: URGENT_BKOPS Bit 3: FRAG_NEEDED Bit 4-15: Reserved | |

In TABLE 2, bit 3 (FRAG_EVENT_EN) of attribute wExceptionEventControl may indicate that the exception event for data fragmentation is enabled. Bit 3 (FRAG_NEEDED) of attribute wExceptionEventStatus (exception events) may be triggered by the flash memory device 430 and may indicate that the data fragmentation status exceeds the threshold, and data fragmentation of the data stored in the flash memory device 430 may be needed.

The data fragment request/interrupt 426 (and therefore, the host 410 incorporating the module) is configured to request the flash memory device 430 (e.g., via the memory bus 420) to fragment data stored in the flash memory device The memory device controller 540 includes some or all of the following modules: data fragmentation status reporting 542, data fragmentation status determination 544, data fragmentation threshold determination-2 546, host exception trigger 548, data fragment 549, and L2P map 533. The modules may be coupled (e.g., information being sent and received among the modules) via a bus system 529 and may communicate with a host (e.g., the host 410 in FIG. 4) via the memory bus 520. The memory device controller 540 may further include L2P map 533. The L2P map 553 stores LBA and PBA pairings and may, for example, include the L2P map 133 of FIG. 1. See examples of the LBA and PBA pairings at the first L2P mapping 103 and the second L2P mapping 105 in FIG. 1.

The data fragmentation status reporting 542 (and the flash memory device 430 incorporating the module) may be configured to receive from a host (e.g., the host 410 in FIG. 4), via a memory bus (e.g., the memory bus 520), a request to report a data fragmentation status of the flash memory device. For example, the flag fFragScanEn (see TABLE 1) may indicate to the data fragmentation status reporting 542 the request from the host to report the data fragmentation status. The data fragmentation status reporting 542 (and the flash memory device 430 incorporating the module) may be further configured to report to the host, via the memory bus, the data fragmentation status to the host. For example, the data fragmentation status reporting 542 may report the data fragmentation status as a percentage via the attribute dFragPercentage (see TABLE 1).

The data fragmentation status determination 544 (and the flash memory device 430 incorporating the module) may be configured to determine the data fragmentation status of the flash memory device, in response to the data fragmentation status reporting 542 receiving the request to report the data fragmentation status. For example, in response to such request, the data fragmentation status determination 544 may scan the L2P map 533 to determine the degree (e.g., in terms of a percentage) of associated pieces of data (e.g., continuous LBAs) stored within a memory portion. The data fragmentation status determination 544 (and the flash memory device 430 incorporating the module) may be configured to halt a determination of the data fragmentation status in response to an interrupt from the host. For example, the host (e.g., the host 410 of FIG. 4) may clear the flag FragScanEn (TABLE 1), and in response, the data fragmentation status determination 544 may be configured to halt the determination of the data fragmentation status by the flash memory device 430, in response to the interrupt from the host.

In some examples, the data fragmentation status determination 544 (and the flash memory device 430 incorporating the module) may be configured to determine the data fragmentation status of the flash memory device without such determination being a response to a specific request from the host determine the data fragmentation status. For example, the data fragmentation status determination 544 may determine the data fragmentation status of the flash memory device (e.g., scanning the L2P map 533) periodically and/or when the flash memory device is not in heavy operations.

The data fragmentation threshold determination-2 546 (and the flash memory device 430 incorporating the module) may be configured to determine the data fragmentation status exceeding a threshold. For example, the data fragmentation threshold determination-2 546 may compare a result of scanning the L2P map 533 with a preset threshold percentage.

The host exception trigger 548 (and the flash memory device 430 incorporating the module) may be configured to trigger an exception event at the host in response to the data fragmentation status exceeding the threshold. For example, in a case that the result of scanning the L2P map 533 exceeds the preset threshold percentage, the host exception trigger 548 may in response trigger (e.g., set) the FRAG_NEEDED bit of the attribute wExceptionEventStatus (see TABLE 2).

The data fragment 549 (and the flash memory device 430 incorporating the module) may be configured to receive from the host, via the memory bus, a request to fragment data stored in the flash memory device. Moreover, the data fragment 549 (and the flash memory device 430 incorporating the module) may be configured fragment the data stored in the flash memory device in response to the request to fragment the data stored in the flash memory device. For example, the data fragment 549 may move the physical locations of data stored in different memory portions of the flash memory device to increase fragmentation of associated pieces of data (e.g., continuous LBAs). As a further example, the data fragment 549 may interleave the physical locations (PBAs) of continuous LBAs among the different memory portions. The data fragment 549 may further be configured to update the L2P map 533 and to indicate to the host the completion of data fragmentation (e.g., set the attribute dFragScanStatus in TABLE 1). The data fragment 549 may be configured to reset the FRAG_NEEDED bit of attribute wExceptionEventStatus (see TABLE 2) to indicate to the host that data fragmentation is no longer needed. Triggering and resetting the exception event in the host may be via the memory bus 520 or other channels.

The data fragment 549 (and the flash memory device 430 incorporating the module) may be further configured to halt the fragmenting of the data in response to an interrupt from the host. For example, the host (e.g., the host 410 of FIG. 4) may clear the FRAG_EVENT_EN bit of the attribute wExceptionEventControl (see TABLE 2) to interrupt the fragmenting of the data by the data fragment 549. The data fragment 549 may be configured, in response to the interrupt, to halt the fragmenting of data stored therein.

Figure 6:
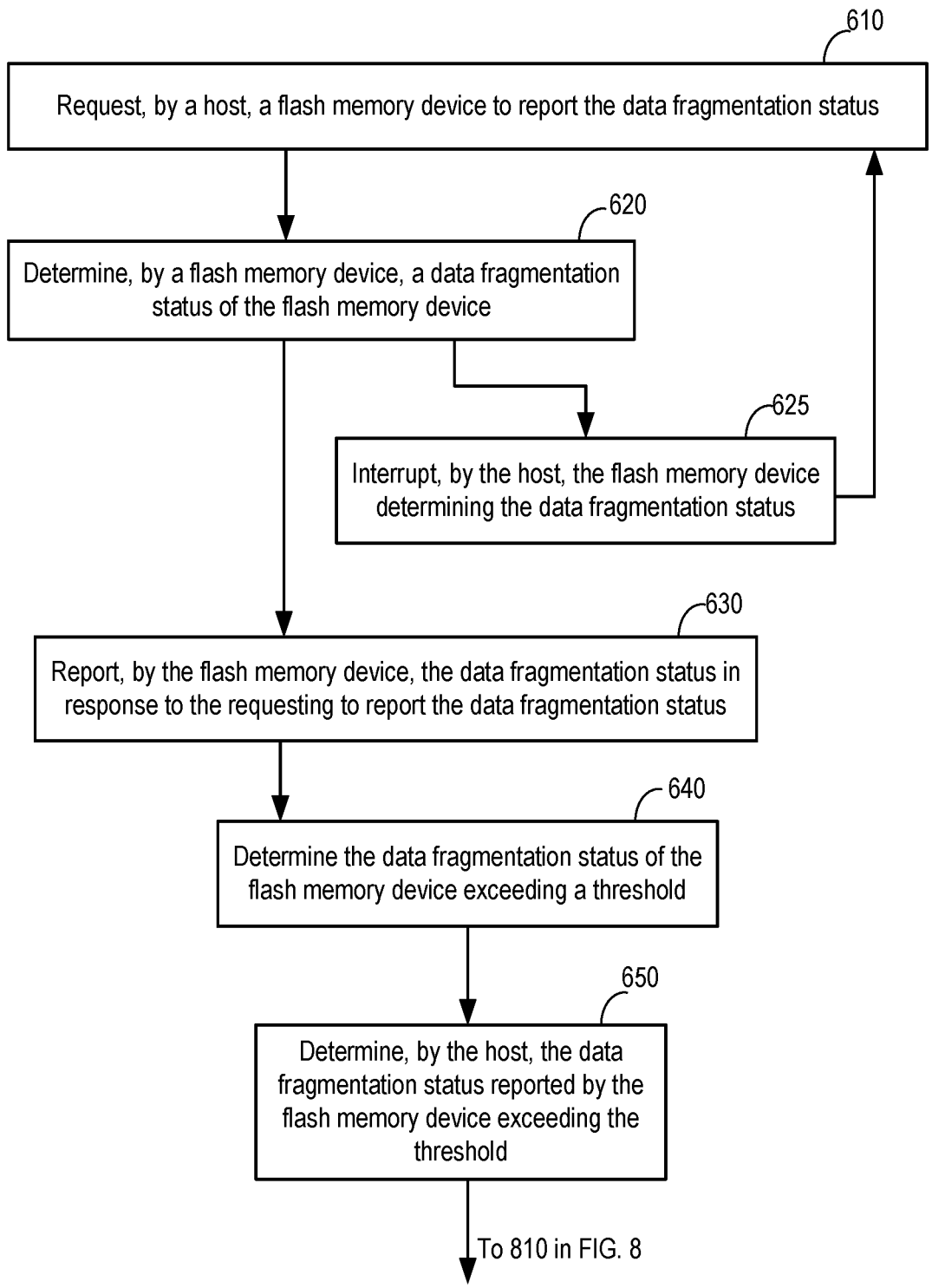
FIG. 6 is a diagram of a first portion of a method to fragment data in a flash memory, in accordance with certain aspects of the disclosure.

FIG. 6 is a diagram of a first portion of a method to fragment data in a flash memory, in accordance with certain aspects of the disclosure. The operations of FIG. 6 may be implemented by, for example, the apparatus 402 presented with FIGS. 4 and 5. The arrows indicate certain relationships among the operations, but not necessarily sequential relationships.

At 610, a flash memory device to report a data fragmentation status is requested by a host. Referring to FIGS. 4 and 5, the data fragmentation status request/interrupt 422 (and therefore, the host 410 incorporating the module) requests, via the memory bus 420, the flash memory device 430 to report a data fragmentation status. For example, the data fragmentation status request/interrupt 422 issues the request periodically, and/or while the host 410 is not in a performance-intensive operation. The request effects the flash memory device 430 to scan data stored therein (e.g., scanning a L2P mapping). The data fragmentation status determination 544 (and the flash memory device 430 incorporating the module) determines the data fragmentation status of the flash memory device, in response to the data fragmentation status reporting 542 receiving the request to report the data fragmentation status.

At 620, the data fragmentation status of a flash memory device is determined by the flash memory device. Referring to FIGS. 4 and 5, the data fragmentation status reporting 542 (and the flash memory device 430 incorporating the module) receives from a host (e.g., the host 410 in FIG. 4), via a memory bus (e.g., the memory bus 520), a request to report a data fragmentation status of the flash memory device. See 610. For example, the flag fFragScanEn (see TABLE 1) indicates to the data fragmentation status reporting 542 the request from the host to report the data fragmentation status.

The data fragmentation status determination 544 (and the flash memory device 430 incorporating the module) determines the data fragmentation status of the flash memory device, in response to the data fragmentation status reporting 542 receiving the request to report the data fragmentation status. For example, in response to such request, the data fragmentation status determination 544 scans the L2P map 533 to determine the degree (e.g., in terms of a percentage) of associated pieces of data (e.g., continuous LBAs) stored within a memory portion.

In some other examples, referring to FIGS. 4 and 5, the data fragmentation status determination 544 (and the flash memory device 430 incorporating the module) determines the data fragmentation status of the flash memory device (e.g., the flash memory device 430 in FIG. 4) without such determination being a response to a specific request from the host (e.g., the host 410 in FIG. 4) to determine the data fragmentation status. For example, the data fragmentation status determination 544 determines the data fragmentation status of the flash memory device (e.g., scans the L2P map 533 to determine the degree that associated pieces of data stored within a memory portion of the flash memory device) periodically and/or when the flash memory device is not in heavy operations.

At 625, the flash memory device determining the data fragmentation status is interrupted by the host. For example, referring to FIG. 4, the data fragmentation status request/interrupt 422 (and therefore, the host 410 incorporating the module) interrupts, via the memory bus 420, the request for the flash memory device 430 to report the data fragmentation status, and accordingly, halts the fragment statue determination process in the flash memory device 430. For example, the flash memory device 430 halts the fragment statue determination process in response to the data fragmentation status request/interrupt 422 interrupting the request to report the data fragmentation status.

In some examples, the data fragmentation status determination 544 (and the flash memory device 430 incorporating the module) halts a determination of the data fragmentation status in response to an interrupt from the host. For example, the host (e.g., the host 410 of FIG. 4) clears the flag FragScanEn (TABLE 1), and in response, the data fragmentation status determination halts the determination of the data fragmentation status by the flash memory device 430, in response to the interrupt from the host. The method may return to 610 (e.g., the host request flash memory device to report or to resume reporting the data fragmentation status).

At 630, the flash memory device to report the data fragmentation status is requested by a host. For example, the data fragmentation status reporting 542 reports to the host, via the memory bus, the data fragmentation status to the host. For example, the data fragmentation status reporting 542 reports the data fragmentation status as a percentage via the attribute dFragPercentage (see TABLE 1).

At 640, the data fragmentation status of the flash memory device exceeding a threshold is determined. The data fragmentation status of the flash memory device exceeding a threshold may be determined by the host (see 650) or the flash memory device (see 660). At 650, the data fragmentation status reported by the flash memory device exceeding the threshold is determined by the host. Referring to FIG. 4, the data fragmentation threshold determination 424 (and therefore, the host 410 incorporating the module) determines whether the data fragmentation status exceeds the threshold. For example, the data fragmentation threshold determination 424 compares the percentage in the attribute dFragPercentage (TABLE 1) to a preset percentage (the threshold). In some examples, the data fragmentation threshold determination 424 (and therefore, the host 410 incorporating the module) determines whether the data fragmentation status exceeds a threshold via an exception event triggered by the flash memory device 430.

Figure 7:
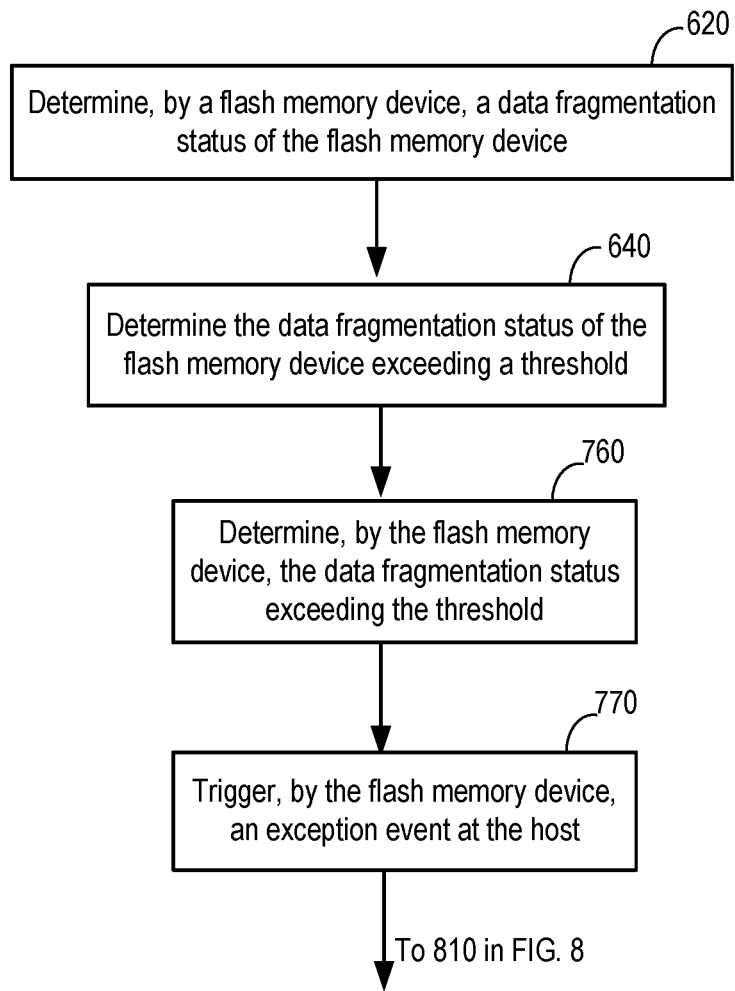
FIG. 7 is a diagram of another example of the first portion of the method to fragment data in a flash memory illustrated in FIG. 6, in accordance with certain aspects of the disclosure.

FIG. 7 is a diagram of another example of the first portion of the method to fragment data in a flash memory illustrated in FIG. 6, in accordance with certain aspects of the disclosure. The operations of FIG. 7 may be implemented by, for example, the apparatus 402 presented with FIGS. 4 and 5. The arrows indicate certain relationships among the operations, but not necessarily sequential relationships.

FIG. 7 illustrates 620, 640, 760, 770 being performed without responding to a specific request from a host. 620 and 640 are as presented with FIG. 6. For example, at 620, the data fragmentation status of a flash memory device is determined by the flash memory device without such determination being a specific response to a host requesting the determination. At 640, the data fragmentation status of the flash memory device exceeding a threshold is determined.

At 760, the data fragmentation status exceeding the threshold is determined by the flash memory device. Referring to FIGS. 4 and 5, the data fragmentation threshold determination-2 546 (and the flash memory device 430 incorporating the module) determines the data fragmentation status exceeding a threshold. For example, the data fragmentation threshold determination-2 546 compares a result of scanning the L2P map 533 with a preset threshold percentage.

At 770, an exception event at the host is triggered by the flash memory device. Referring to FIG. 5, the host exception trigger 548 (and the flash memory device 430 incorporating the module) triggers an exception event at the host in response to the data fragmentation status exceeding the threshold. For example, in a case that the result of scanning the L2P map 533 exceeds the preset threshold percentage, the host exception trigger 548 in response triggers (e.g., set) the FRAG_NEEDED bit of the attribute wExceptionEventStatus (see TABLE 2).

640, 760, 770 are performed without being responding to specific request from the host. For example, the memory device controller 540 in FIG. 5 (and the flash memory device 430 in FIG. 4 incorporating the memory device controller 540) may perform 620, 640, 760, 770 as described with FIG. 6, without inputs/requests from a host.

Figure 8:
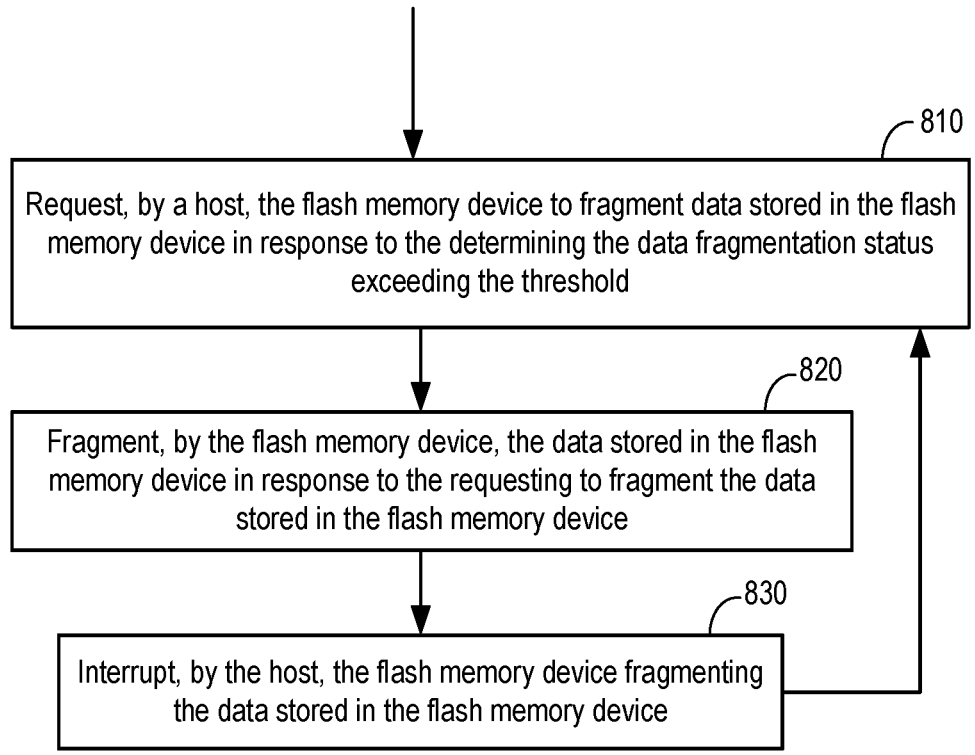
FIG. 8 is a diagram of a second portion of the method to fragment data in a flash memory, in accordance with certain aspects of the disclosure.

FIG. 8 is a diagram of a second portion of the method to fragment data in a flash memory, in accordance with certain aspects of the disclosure. The operations of FIG. 8 may be implemented by, for example, the apparatus 402 presented with FIGS. 4 and 5. The arrows indicate certain relationships among the operations, but not necessarily sequential relationships. 810 may follow 650 in FIG. 6 or follow 770 in FIG. 7.

At 810, fragment data stored in the flash memory device is requested by the host, in response to the determining the data fragmentation status exceeding the threshold. Referring to FIG. 4, the data fragment request/interrupt 426 (and therefore, the host 410 incorporating the module) requests the flash memory device 430 (e.g., via the memory bus 420) to fragment data stored in the flash memory device 430, in response to the determination of the data fragmentation status exceeding the threshold (see 650 or 670 in FIG. 6; 670 in FIG. 7). For example, the data fragment request/interrupt 426 sets the flag fFragScanEn (TABLE 1) to request the data fragmentation.

At 820, the data stored in the flash memory device is fragmented by the flash memory device in response to the requesting to fragment the data stored in the flash memory device. Referring to FIGS. 4 and 5, the data fragment 549 (and the flash memory device 430 incorporating the module) fragments the data stored in the flash memory device. For example, the data fragment 549 moves the physical locations of data stored to different memory portions of the flash memory device to increase fragmentation of associated pieces of data (e.g., continuous LBAs). As a further example, the data fragment 549 interleaves the physical locations (PBAs) of continuous LBAs among the different memory portions. The data fragment 549 updates the L2P map 533 and to indicate to the host the completion of data fragmentation (e.g., up the attribute dFragScanStatus in TABLE 1). The data fragment 549 resets the FRAG_NEEDED bit of attribute wExceptionEventStatus (see TABLE 2) to indicate to the host that data fragmentation is no longer needed.

At 830, the flash memory device fragmenting the data stored in the flash memory device is interrupt by the host. Referring to FIG. 4, for example, the data fragment request/interrupt 426 (and therefore, the host 410 incorporating the module) further issues an interrupt to halt the data fragment operation under certain conditions. In some examples, the method may return to 810 to allow the host to request the flash memory device to fragment or to resume fragment data stored in the flash memory device.

Appendix I, provided herewith, is incorporated in reference in its entirety.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. An apparatus, comprising:
 a host configured to request a flash memory device, via a memory bus, to fragment data stored in the flash memory device in response to a determination of a data fragmentation status, corresponding to a distribution of continuous data within a memory portion, of the flash memory device exceeding a threshold, wherein the determination of the data fragmentation status exceeding the threshold is based on comparing a percentage of fragmentation to a preset percentage.

2. The apparatus of claim 1, further comprising the flash memory device and the memory bus.

3. The apparatus of claim 2, wherein the flash memory device is further configured to fragment the data stored in the flash memory device in response to the request to fragment the data stored in the flash memory device.

4. The apparatus of claim 3, further comprising one of a computing system, a mobile computing system, an Internet of Things device, and a virtual reality or augmented reality system incorporating the host, the flash memory device, and the memory bus.

5. The apparatus of claim 4, wherein the flash memory device is further configured to determine the data fragmentation status of the flash memory device.

6. The apparatus of claim 5, wherein the host is further configured to request, via the memory bus, the flash memory device to report the data fragmentation status,
 the flash memory device is further configured to report, via the memory bus, the data fragmentation status in response to the request to report the data fragmentation status, and
 the host is further configured to determine the data fragmentation status reported by the flash memory device exceeding the threshold.

7. The apparatus of claim 4, wherein the host is further configured to interrupt the flash memory device determining the data fragmentation status.

8. The apparatus of claim 4, wherein the flash memory device is configured to determine the data fragmentation status without responding to a specific request from the host to determine the data fragmentation status.

9. The apparatus of claim 8, wherein the flash memory device is configured to determine the data fragmentation status exceeding the threshold and to trigger an exception event at the host in response to the data fragmentation status exceeding the threshold.

10. The apparatus of claim 4, wherein the host is further configured to interrupt the flash memory device fragmenting the data stored in the flash memory device.

11. An apparatus comprising:
 a flash memory device configured to receive from a host, via a memory bus, a request to fragment data stored in the flash memory device and to fragment the data stored in the flash memory device, to increase fragmentation of a piece of continuous data, in response to the request to fragment the data stored in the flash memory device,
 wherein the flash memory device is further configured to:
  determine a data fragmentation status of the flash memory device;
  determine the data fragmentation status exceeds a threshold based on comparing a percentage of fragmentation to a preset percentage; and
  trigger an exception event at the host in response to the data fragmentation status exceeding the threshold.

12. The apparatus of claim 11, wherein the flash memory device is further configured to receive from the host, via the memory bus, a request to report the data fragmentation status of the flash memory device and to determine the data fragmentation status of the flash memory device in response to the request to report the data fragmentation status, and wherein the flash memory device is further configured to report to the host, via the memory bus, the data fragmentation status.

13. The apparatus of claim 12, wherein the flash memory device is further configured to halt the determination of the data fragmentation status in response to an interrupt from the host.

14. The apparatus of claim 11, further comprising one of a computing system, a mobile computing system, an Internet of Things device, and a virtual reality or augmented reality system incorporating the flash memory device, the host, and the memory bus.

15. The apparatus of claim 11, wherein the flash memory device is configured to determine the data fragmentation status of the flash memory device without responding to a specific request from the host to determine the data fragmentation status.

16. The apparatus of claim 11, wherein the flash memory device is further configured to halt fragmenting the data in response to an interrupt from the host.

17. The apparatus of claim 16, further comprising one of a computing system, a mobile computing system, an Internet of Things device, and a virtual reality or augmented reality system incorporating the flash memory device, the host, and the memory bus.

18. The apparatus of claim 11, wherein the flash memory device comprises a universal flash storage (UFS) device.

19. A method to fragment data in a flash memory device, comprising:
   determining a data fragmentation status, corresponding to a distribution of continuous data within a memory portion, of the flash memory device exceeding a threshold, wherein determining the data fragmentation status exceeding the threshold comprises comparing a percentage of fragmentation to a preset percentage;
   requesting, by a host, the flash memory device to fragment data stored in the flash memory device in response to determining the data fragmentation status exceeding the threshold.

20. The method of claim 19, further comprising:
   fragmenting, by the flash memory device, the data stored in the flash memory device in response to requesting to fragment the data stored in the flash memory device.

21. The method of claim 20, further comprising:
   determining, by the flash memory device, the data fragmentation status of the flash memory device.

22. The method of claim 21, further comprising:
   requesting, by the host, the flash memory device to report the data fragmentation status; and
   reporting, by the flash memory device, the data fragmentation status in response to requesting to report the data fragmentation status, wherein determining the data fragmentation status exceeding the threshold comprises determining, by the host, the data fragmentation status reported by the flash memory device exceeding the threshold.

23. The method of claim 21, further comprising:
   interrupting, by the host, the flash memory device determining the data fragmentation status.

24. The method of claim 21, wherein the flash memory device determines the data fragmentation status without responding to a specific request from the host to determine the data fragmentation status.

25. The method of claim 24, further comprising:
   determining, by the flash memory device, the data fragmentation status exceeding the threshold; and
   triggering, by the flash memory device, an exception event at the host in response to the data fragmentation status exceeding the threshold.

26. The method of claim 21, further comprising:
   interrupting, by the host, the flash memory device fragmenting the data stored in the flash memory device.

* * * * *